(12) United States Patent
Shirasaki

(10) Patent No.: US 12,389,543 B2
(45) Date of Patent: Aug. 12, 2025

(54) WIRING BOARD, PACKAGE FOR CONTAINING ELECTRONIC COMPONENT, ELECTRONIC DEVICE, AND ELECTRONIC MODULE

(71) Applicant: KYOCERA Corporation, Kyoto (JP)

(72) Inventor: Takayuki Shirasaki, Kyoto (JP)

(73) Assignee: KYOCERA CORPORATION, Kyoto (JP)

( * ) Notice: Subject to any disclaimer, the term of this patent is extended or adjusted under 35 U.S.C. 154(b) by 135 days.

(21) Appl. No.: 18/273,222

(22) PCT Filed: Jan. 17, 2022

(86) PCT No.: PCT/JP2022/001365
§ 371 (c)(1),
(2) Date: Jul. 19, 2023

(87) PCT Pub. No.: WO2022/158416
PCT Pub. Date: Jul. 28, 2022

(65) Prior Publication Data
US 2024/0306302 A1  Sep. 12, 2024

(30) Foreign Application Priority Data
Jan. 19, 2021  (JP) .................................. 2021-006333

(51) Int. Cl.
*H05K 1/02* (2006.01)
*H05K 1/18* (2006.01)
*H05K 7/14* (2006.01)

(52) U.S. Cl.
CPC .......... *H05K 1/181* (2013.01); *H05K 1/0296* (2013.01); *H05K 7/1427* (2013.01)

(58) Field of Classification Search
CPC .................................................. H05K 1/0296
See application file for complete search history.

(56) References Cited

U.S. PATENT DOCUMENTS 9,270,001 B2 * 2/2016 Hirayama ............ G02B 6/4281
2011/0222247 A1 * 9/2011 Motohashi ........... H05K 1/0227
361/748

FOREIGN PATENT DOCUMENTS

JP   2001-102820 A    4/2001
JP   2004-319650 A    11/2004

(Continued)

*Primary Examiner* — Sherman Ng
(74) *Attorney, Agent, or Firm* — Volpe Koenig

(57) ABSTRACT

A wiring board includes a base, a signal conductor, two first ground conductors, a second ground conductor, and connection conductors. The base is composed of a dielectric and includes a first surface and a second surface opposite to the first surface. The signal conductor is disposed on the first surface and extends to an end portion of the base. The two first ground conductors are disposed on the first surface and extend to the end portion with the signal conductor disposed between the first ground conductors. The second ground conductor is disposed in the base or on the second surface. The second ground conductor faces the signal conductor and extends to the end portion. The connection conductors electrically connect respective ones of the first ground conductors to the second ground conductor. The signal conductor and the second ground conductor are separated from each other by a distance H.

8 Claims, 15 Drawing Sheets

(56) References Cited

FOREIGN PATENT DOCUMENTS

| | | |
|---|---|---|
| JP | 2006-086146 A | 3/2006 |
| JP | 2007-006065 A | 1/2007 |
| JP | 2009-076828 A | 4/2009 |

* cited by examiner

WIRING BOARD, PACKAGE FOR CONTAINING ELECTRONIC COMPONENT, ELECTRONIC DEVICE, AND ELECTRONIC MODULE

TECHNICAL FIELD

The present disclosure relates to a wiring board, a package for containing an electronic component, an electronic device, and an electronic module.

BACKGROUND OF INVENTION

A known wiring board includes a signal conductor, first ground conductors, and a second ground conductor (for example, a relay substrate described in Japanese Unexamined Patent Application Publication No. 2006-086146). The signal conductor extends to an end portion of a substrate surface. The first ground conductors extend to the end portion of the substrate surface with the signal conductor disposed between the first ground conductors. The second ground conductor faces the signal conductor and extends to an end portion of a substrate. This structure enables low-loss transmission of a high-frequency signal to an end portion of the wiring board.

SUMMARY

Solution to Problem

In the present disclosure, a wiring board includes a base, a signal conductor, two first ground conductors, a second ground conductor, and connection conductors. The base is composed of a dielectric and includes a first surface and a second surface opposite to the first surface. The signal conductor is disposed on the first surface and extends to an end portion of the base. The two first ground conductors are disposed on the first surface and extend to the end portion with the signal conductor disposed between the first ground conductors. The second ground conductor is disposed in the base or on the second surface. The second ground conductor faces the signal conductor and extends to the end portion. The connection conductors electrically connect respective ones of the first ground conductors to the second ground conductor. The signal conductor and the second ground conductor are separated from each other by a distance H. At least one selected from the group consisting of the signal conductor and the first ground conductors includes a pattern disposed at a distance of equal to or greater than ⅓ of the distance H and equal to or less than the distance H from the end portion. The pattern is inductive.

In the present disclosure, a package for containing an electronic component includes the above-described wiring board and a metal case configured to contain an electronic component.

In the present disclosure, an electronic device includes the above-described package for containing an electronic component and an electronic component mounted in the package for containing an electronic component.

In another aspect of the present disclosure, an electronic device includes the above-described wiring board and an electronic component electrically connected to the wiring board.

In the present disclosure, an electronic module includes the above-described electronic device and a module substrate. The electronic device is mounted on the module substrate.

DESCRIPTION OF EMBODIMENTS

Embodiments of the present disclosure will be described in detail with reference to the drawings.

Figure 1:
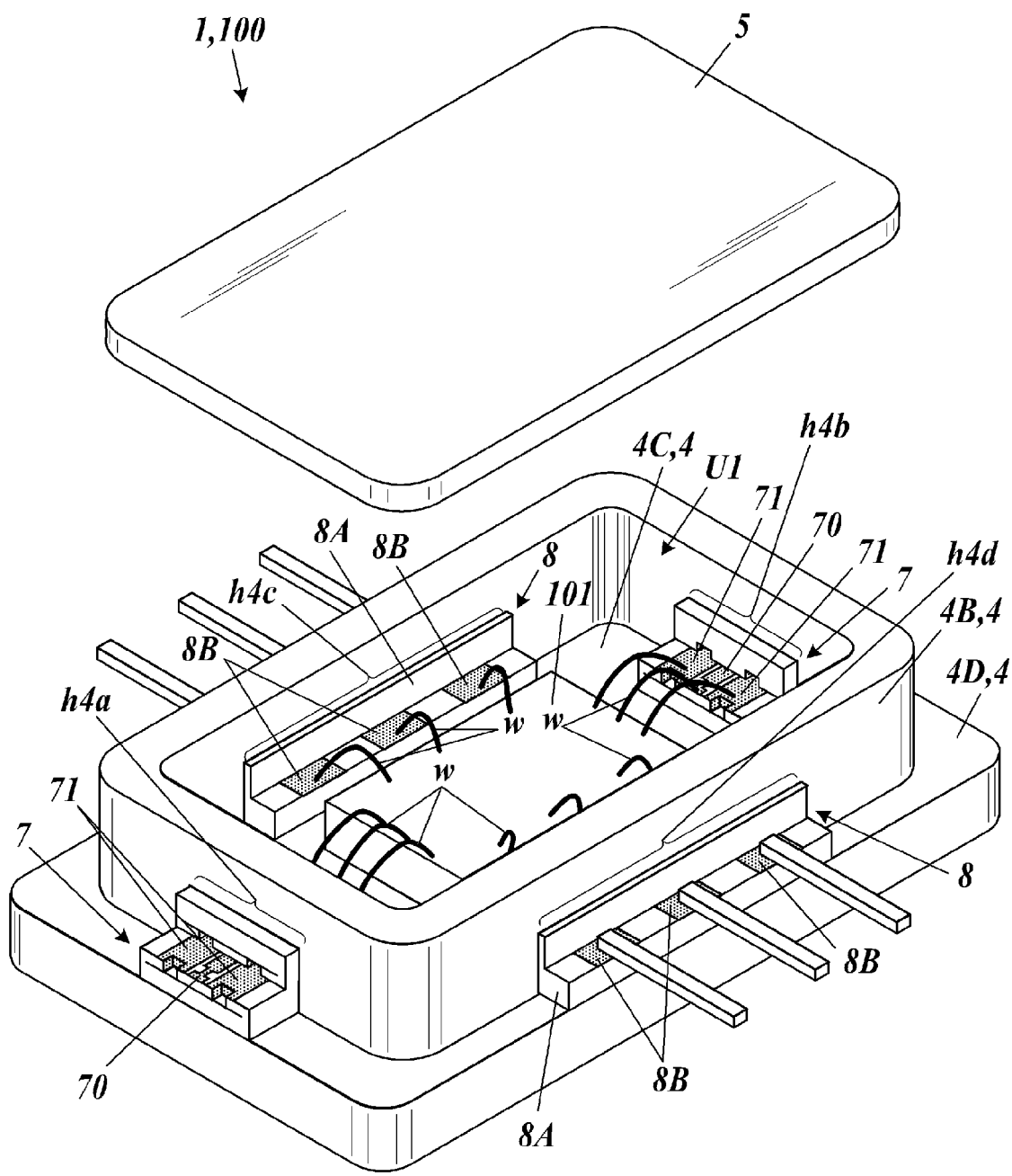
FIG. 1 is a perspective view of a package for containing an electronic component and an electronic device according to an embodiment of the present disclosure.

FIG. 1 is a perspective view of a package for containing an electronic component and an electronic device according to an embodiment of the present disclosure. In the present disclosure, a package 1 for containing an electronic component includes a metal case 4, wiring boards 7, non-high-frequency wiring boards 8, and a lid 5. The metal case 4 includes a recess U1 and is made of a metal. The wiring boards 7 and the non-high-frequency wiring boards 8 are attached to the metal case 4. The lid 5 covers an opening of the recess U1. The metal case 4 includes a wall 4B and a bottom 4C. The wall 4B surrounds the recess U1. The recess U1 accommodates an electronic component 101. Bonding wires serving as connection members w electrically connect terminals of the electronic component 101 to the wiring boards 7 and the non-high-frequency wiring boards 8.

The metal case 4 includes through holes h4a to h4d extending through the wall 4B. The wiring boards 7 and the non-high-frequency wiring boards 8 are fitted to the through holes h4a to h4d and block the through holes h4a to h4d. Thus, the wiring boards 7 and the non-high-frequency wiring boards 8 are attached to the metal case 4. The metal case 4 may include a mount base 4D. The mount base 4D supports the wiring boards 7 and the non-high-frequency wiring boards 8 from below in a region outside the wall 4B. The mount base 4D and the bottom 4C may be an integral plate. In such a case, the mount base 4D may be an outer edge portion of the bottom 4C protruding outward from the wall 4B. The wiring boards 7 and the non-high-frequency wiring boards 8 are disposed on the bottom 4C in a region inside the wall 4B and on the mount base 4D in a region outside the wall 4B. The recess U1 is sealed when the lid 5 is joined to the metal case 4.

The wiring boards 7 transmit a high-frequency signal. The non-high-frequency wiring boards 8 guide, for example, a non-high-frequency signal or voltage, such as a power supply voltage. In the following description, end portions of the wiring boards 7 and the non-high-frequency wiring boards 8 disposed in the recess U1 are referred to as "inner end portions", and end portions on the exterior of the package are referred to as "outer end portions". The end portions are portions including ends and regions around the ends. The wiring boards 7 correspond to a wiring board according to the present disclosure.

Each of the non-high-frequency wiring boards 8 includes an insulative base 8A and wiring conductors 8B. The wiring conductors 8B extend from an inner end portion to an outer end portion of the base 8A and are exposed on an upper surface of the base 8A in regions inside and outside the recess U1. The wiring conductors 8B exposed on the upper surface of the base 8A include inner end portions to which respective ones of the connection members w, such as bonding wires, are connectable. The wiring conductors 8B include outer end portions to which terminal members, such as lead terminals for providing external connections, are connectable.

Figure 2A:
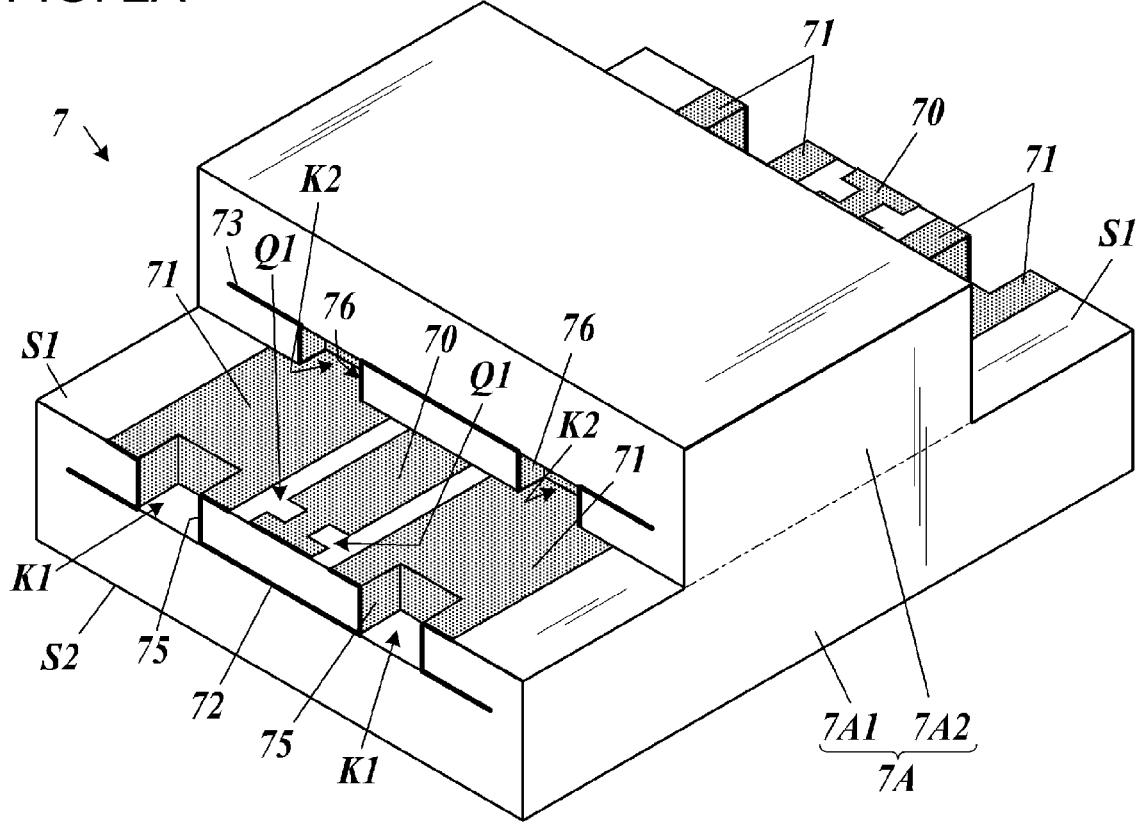
FIG. 2A is a perspective view of a wiring board according to the embodiment.
Figure 2B:
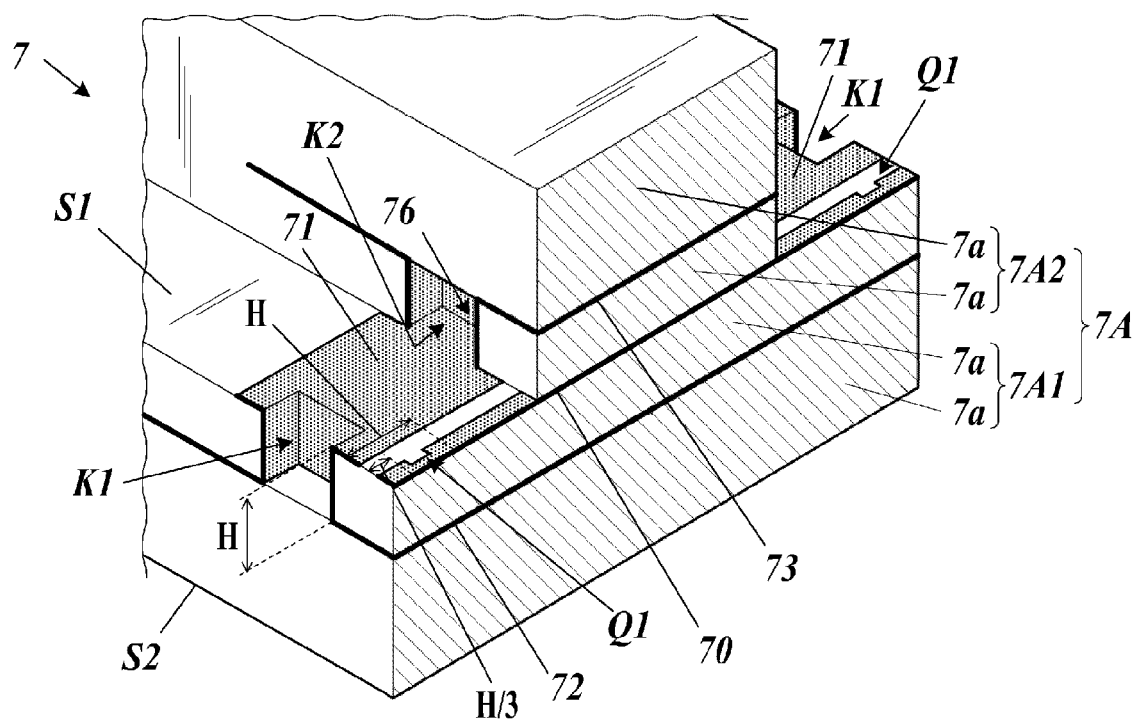
FIG. 2B is a cutaway perspective view of the wiring board according to the embodiment that is vertically cut.
Figure 3A:
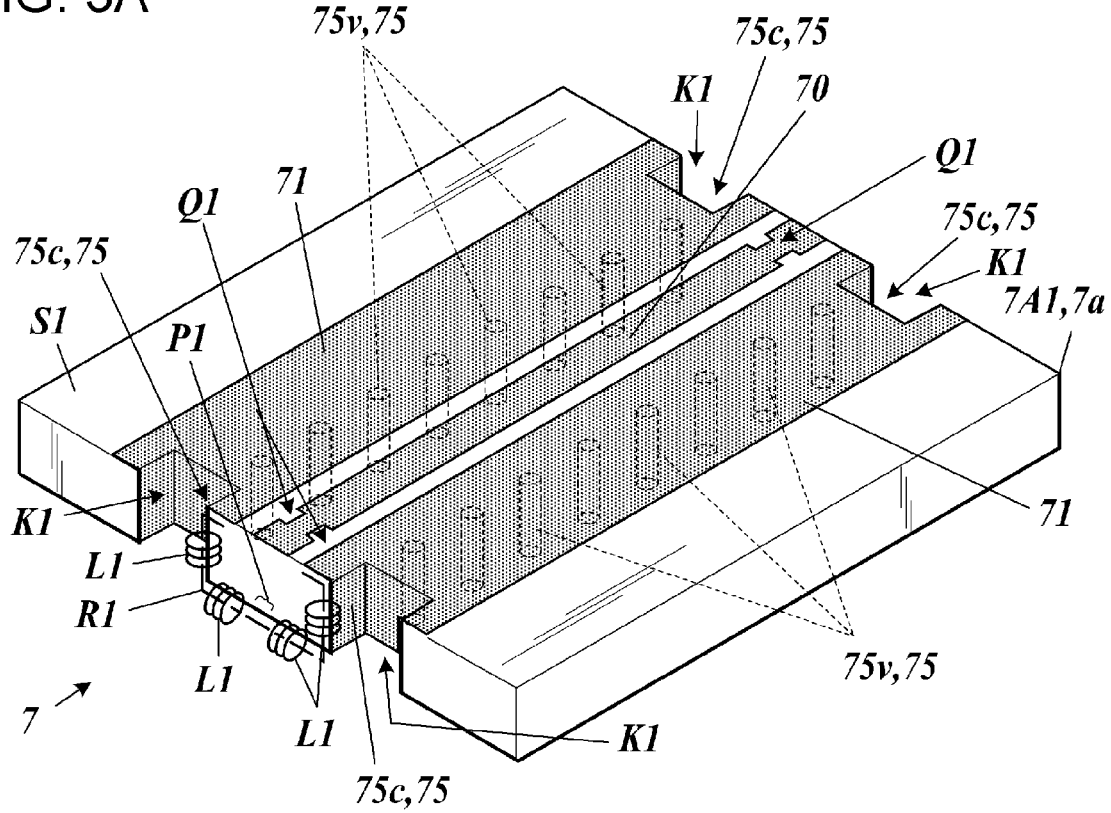
FIG. 3A is a perspective view of a relevant part removed from the wiring board according to the embodiment and viewed from above.
Figure 3B:
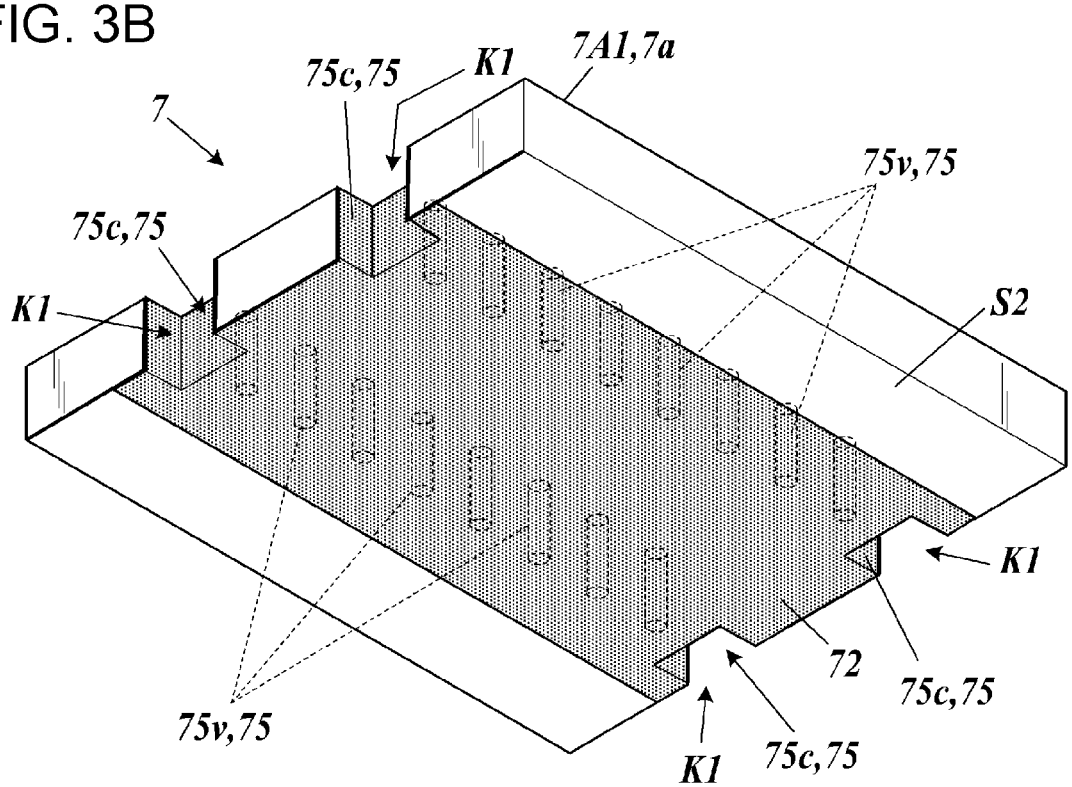
FIG. 3B is a perspective view of the relevant part removed from the wiring board according to the embodiment and viewed from below.

FIG. 2A is a perspective view of a wiring board according to the embodiment. FIG. 2B is a cutaway perspective view of the wiring board that is vertically cut. FIGS. 3A and 3B illustrate a relevant part removed from the wiring board according to the embodiment. FIG. 3A is a perspective view of the relevant part viewed from above. FIG. 3B is a perspective view of the relevant part viewed from below. In FIGS. 1, 2A, and 2B and structural drawings described below, the hatched regions are film-shaped conductors. In FIGS. 2A and 2B, the thick solid lines are ends of the film-shaped conductors at an end surface or a cross section of a base 7A.

As illustrated in FIGS. 2A and 2B, each wiring board 7 includes a signal conductor 70, first ground conductors 71, a second ground conductor 72, a third ground conductor 73, connection conductors 75, connection conductors 76, and the base 7A. The connection conductors 75 electrically connect the first ground conductors 71 to the second ground conductor 72. The connection conductors 76 electrically connect the first ground conductors 71 to the third ground conductor 73. The conductors are disposed in and/or on the base 7A.

The base 7A is composed of a dielectric. The base 7A may include a multilayer structure including a plurality of dielectric layers 7a. The dielectric may be a ceramic. The base 7A includes a plate-shaped portion 7A1 and a step portion 7A2. The plate-shaped portion 7A1 is plate-shaped and includes a first surface S1. The step portion 7A2 is step-shaped and projects from the plate-shaped portion 7A1. The step portion 7A2 is disposed on the first surface S1 at a location between an inner end portion and an outer end portion of the plate-shaped portion 7A1. The step portion 7A2 is in contact with the wall 4B of the metal case 4 and insulates the wall 4B and the signal conductor 70 from each other.

The signal conductor 70, the first ground conductors 71, the second ground conductor 72, and the third ground conductor 73 are film-shaped conductors. The shapes of the signal conductor 70, the first ground conductors 71, the second ground conductor 72, and the third ground conductor 73 may be, but are not particularly limited to, a flat shape.

The width and thickness of the signal conductor 70, the interval between each first ground conductor 71 and the signal conductor 70, the interval between the signal conductor 70 and the second ground conductor 72, the interval between the signal conductor 70 and the third ground conductor 73, and the intervals between the connection conductors 75 and 76 are designed to match a predetermined impedance in accordance with the frequency of a transmission signal and the relative dielectric constant of the base 7A. The interval between each first ground conductor 71 and the third ground conductor 73 is designed to be ¼ or less of the effective wavelength of the high-frequency signal. The interval between the connection conductors 75 disposed on both sides of the signal conductor 70 is designed to be ½ or less of the effective wavelength of the high-frequency signal. The frequency of the signal may be in the 80 GHz band or higher than the 80 GHz band.

The signal conductor 70 extends from the inner end portion to the outer end portion along the first surface S1 of the plate-shaped portion 7A1. The signal conductor 70 may extend along a straight line.

The first ground conductors 71 extend from the inner end portion to the outer end portion along the first surface S1 of the plate-shaped portion 7A1. The signal conductor 70 is disposed between and spaced from two first ground conductors 71 in a transverse direction of the signal conductor 70.

The second ground conductor 72 extends from the inner end portion to the outer end portion of the plate-shaped portion 7A1 in the plate-shaped portion 7A1. The second ground conductor 72 faces the signal conductor 70 and is separated from the signal conductor 70 by a constant distance H (see FIG. 2B) over the entire region of the signal conductor 70 in the longitudinal direction of the signal conductor 70. The distance between the signal conductor 70 and the second ground conductor 72 is H. The second ground conductor 72 also faces each first ground conductor 71 and is separated from the first ground conductor 71 by the distance H. The second ground conductor 72 may be disposed on a second surface S2 of the plate-shaped portion 7A1, the second surface S2 being opposite to the first surface S1. The second ground conductor 72 can be regarded as facing each of the signal conductor 70 and the first ground conductors 71 with a dielectric of thickness H disposed between the second ground conductor 72 and each of the signal conductor 70 and the first ground conductors 71. The second ground conductor 72 extends to positions separated from side surfaces of the base 7A (FIG. 2A). However, the second ground conductor 72 may extend to the side surfaces of the base 7A.

The third ground conductor 73 extends from an inner end portion to an outer end portion of the step portion 7A2 in the step portion 7A2. The third ground conductor 73 extends at a constant distance from the signal conductor 70 and the first ground conductors 71.

As illustrated in FIGS. 3A and 3B, each connection conductor 75 includes castellation conductors 75c and a plurality of via conductors 75v. The castellation conductors 75c are disposed on inner and outer sides of the plate-shaped portion 7A1 (inside and outside the recess U1). Each via conductor 75v extends between a corresponding one of the first ground conductors 71 and the second ground conductor 72 in the plate-shaped portion 7A1. The castellation conductors 75c are film-shaped conductors disposed on surfaces of grooves (or recesses) K1 on the inner and outer sides of the plate-shaped portion 7A1. The grooves K1 and the castellation conductors 75c may be omitted. In place of the castellation conductors 75c, the via conductors 75v may be disposed near the inner and outer end portions of the plate-shaped portion 7A1. As described above, the interval between two connection conductors 75 (two castellation conductors 75c) in the direction in which the connection conductors 75 face each other with the signal conductor 70 disposed therebetween is ½ or less of the effective wavelength of the high-frequency signal. The interval between the via conductors 75v in the plate-shaped portion 7A1 in the direction in which the via conductors 75v face each other with the signal conductor 70 disposed therebetween is also ½ or less of the effective wavelength of the high-frequency signal. The intervals between the via conductors 75v in the direction in which the via conductors 75v are arranged along the signal conductor 70 are ¼ or less of the effective wavelength of the high-frequency signal.

As illustrated in FIGS. 2A and 2B, each connection conductor 76 includes castellation conductors and a plurality of via conductors that are not illustrated. The castellation conductors are disposed on inner and outer sides of the step portion 7A2 (inside and outside the recess U1). Each via conductor extends between a corresponding one of the first ground conductors 71 and the third ground conductor 73 in the step portion 7A2. The castellation conductors are film-shaped conductors disposed on surfaces of grooves (or recesses) K2 on the inner and outer sides of the step portion 7A2. The grooves K2 and the castellation conductors may be omitted. In place of the castellation conductors, the via conductors may be disposed near the inner and outer end portions of the step portion 7A2. The third ground conductor 73 and the connection conductors 76 may be omitted.

<Inductive Patterns>

As illustrated in FIGS. 2A and 2B, the signal conductor 70 includes inductive patterns Q1 located at a distance in the range of H/3 or more and H or less from an end of the first surface S1. Here, H is the distance between the signal conductor 70 and the second ground conductor 72. In FIG. 1, the patterns Q1 are simplified, and the positions and sizes thereof differ from the actual positions and sizes. In place of the patterns Q1 of the signal conductor 70, the first ground conductors 71 may include inductive patterns at sides adjacent to the signal conductor 70. An inductive pattern is a pattern that causes an increase in an inductance of the signal conductor 70 compared to that when the pattern is not present in a region including the pattern.

<Effects of Patterns>

At the inner and outer end portions of the plate-shaped portion 7A1, the connection conductors 75 and the second ground conductor 72 are terminated in a signal transmission direction (longitudinal direction of the signal conductor 70). Accordingly, as illustrated in FIG. 3A, a current path R1 is formed along an end surface of the wiring board 7. When inductance components L1 are generated on the current path R1, current density is reduced in a central portion P1 of the second ground conductor 72. Thus, the ground voltage becomes unstable. In the present embodiment, the patterns Q1 of the signal conductor 70 or the patterns of the first ground conductors 71 at the sides adjacent to the signal conductor 70 generate an inductance component in a region near the end portion of the signal conductor 70. Accordingly, the inductance component is matched with the inductance components L1 on the current path R1, so that degradation of high-frequency characteristics of signal transmission is reduced. Thus, the high-frequency characteristics of signal transmission can be improved.

Figure 4A:
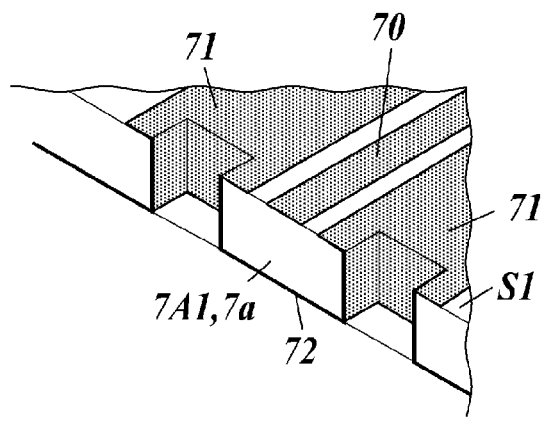
FIG. 4A is a perspective view of patterns according to a first reference example.
Figure 4E:
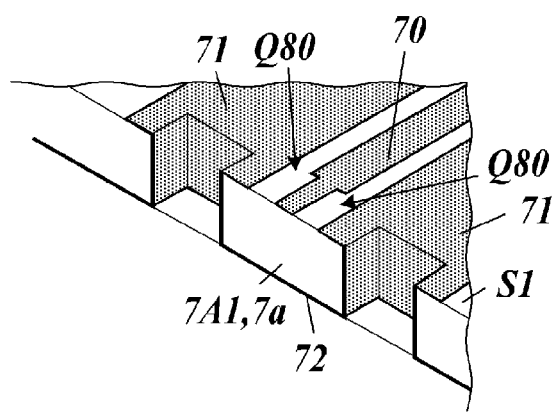
FIG. 4E is a perspective view of patterns according to a second reference example.
Figure 5A:
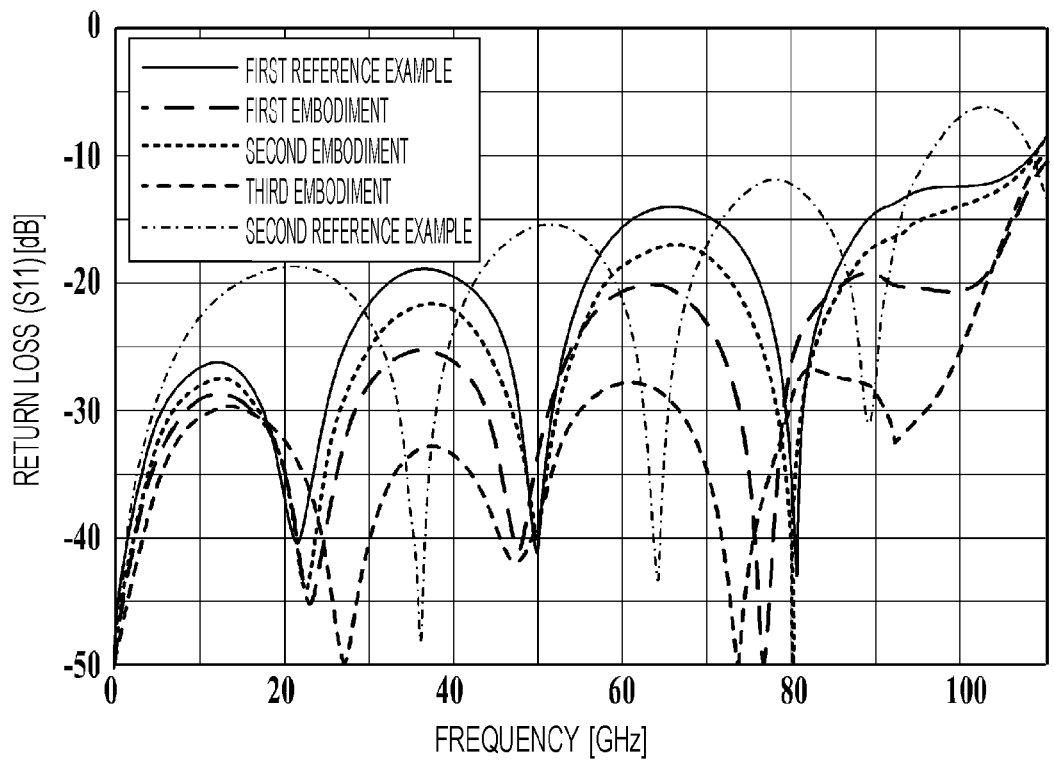
FIG. 5A is a graph illustrating return loss characteristics of the first and second reference examples and the first to third embodiments.
Figure 5B:
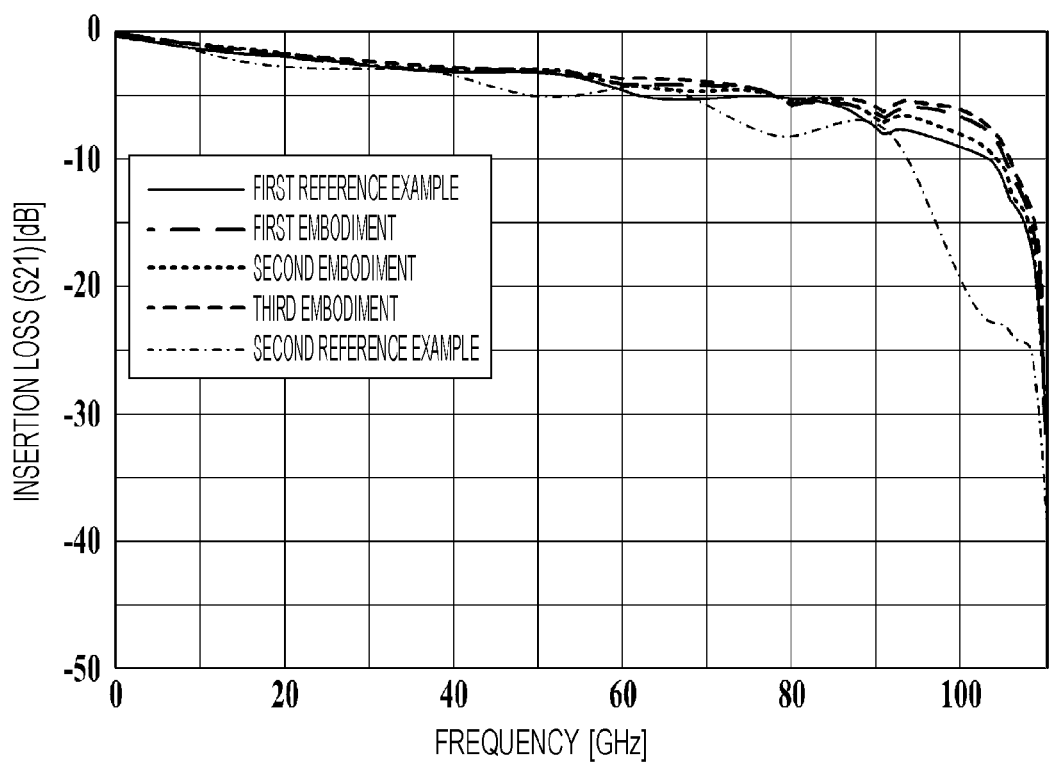
FIG. 5B is a graph illustrating insertion loss characteristics of the first and second reference examples and the first to third embodiments.

FIGS. 5A and 5B are graphs illustrating the results of simulations of return loss characteristics and insertion loss characteristics of the wiring board 7 according to a first embodiment. The graphs of FIGS. 5A and 5B also illustrate the characteristics of a first reference example illustrated in FIG. 4A and a second reference example illustrated in FIG. 4E. In the first reference example illustrated in FIG. 4A, the signal conductor 70 and the first ground conductors 71 include no inductive patterns. In the second reference example illustrated in FIG. 4E, inductive patterns Q80 extend to a location at a distance of H/3 or less from the end portion of the first surface S1.

As is clear from the comparison between the curve of the first embodiment and the curve of the first reference example in FIGS. 5A and 5B, according to the wiring board 7 of the first embodiment, since the patterns Q1 are provided, the return loss in a high frequency band is reduced, and the attenuation of an insertion signal in a high frequency band is also reduced.

As is clear from the comparison between the curve of the first embodiment and the curve of the second reference example in FIGS. 5A and 5B, when the inductive patterns Q1 are separated from the end of the first surface S1 by H/3 or more, the return loss in a high frequency band is reduced, and the attenuation of an insertion signal in a high frequency band is also reduced.

<Examples of Patterns>

Figure 4B:
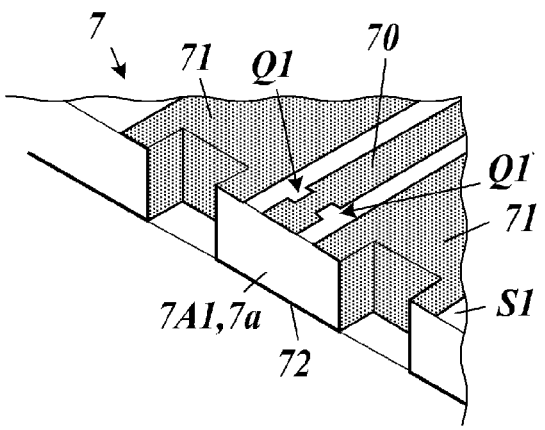
FIG. 4B is a perspective view of patterns according to a first embodiment.
Figure 4C:
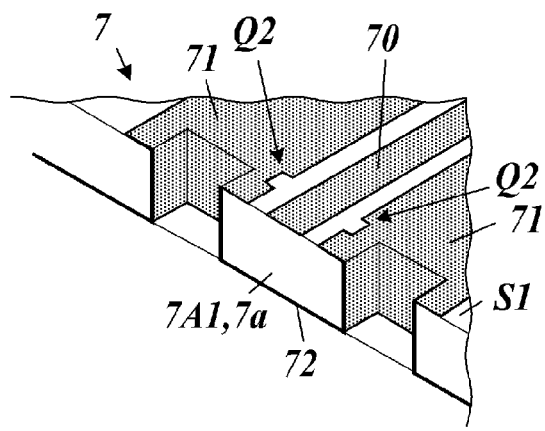
FIG. 4C is a perspective view of patterns according to a second embodiment.
Figure 4D:
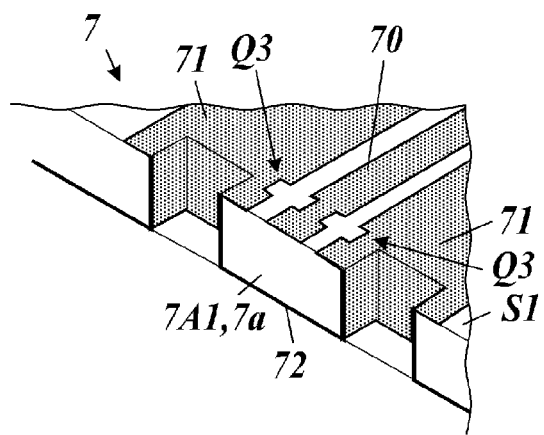
FIG. 4D is a perspective view of patterns according to a third embodiment.
Figure 6A:
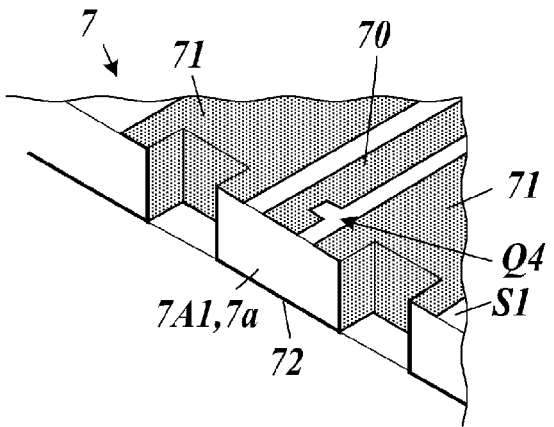
FIG. 6A is a perspective view of a pattern according to a fourth embodiment.
Figure 6B:
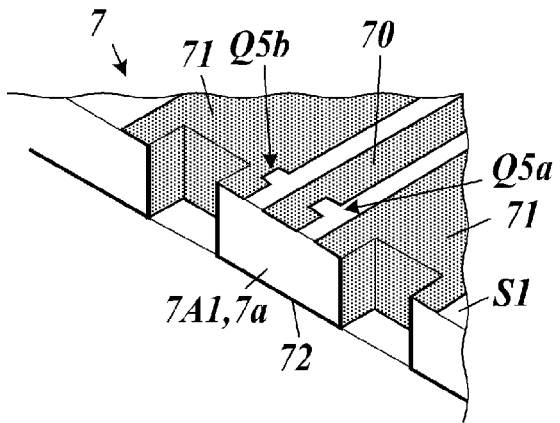
FIG. 6B is a perspective view of patterns according to a fifth embodiment.
Figure 6C:
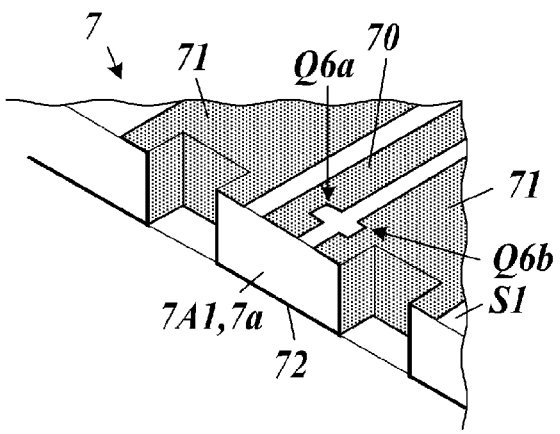
FIG. 6C is a perspective view of patterns according to a sixth embodiment.
Figure 7A:
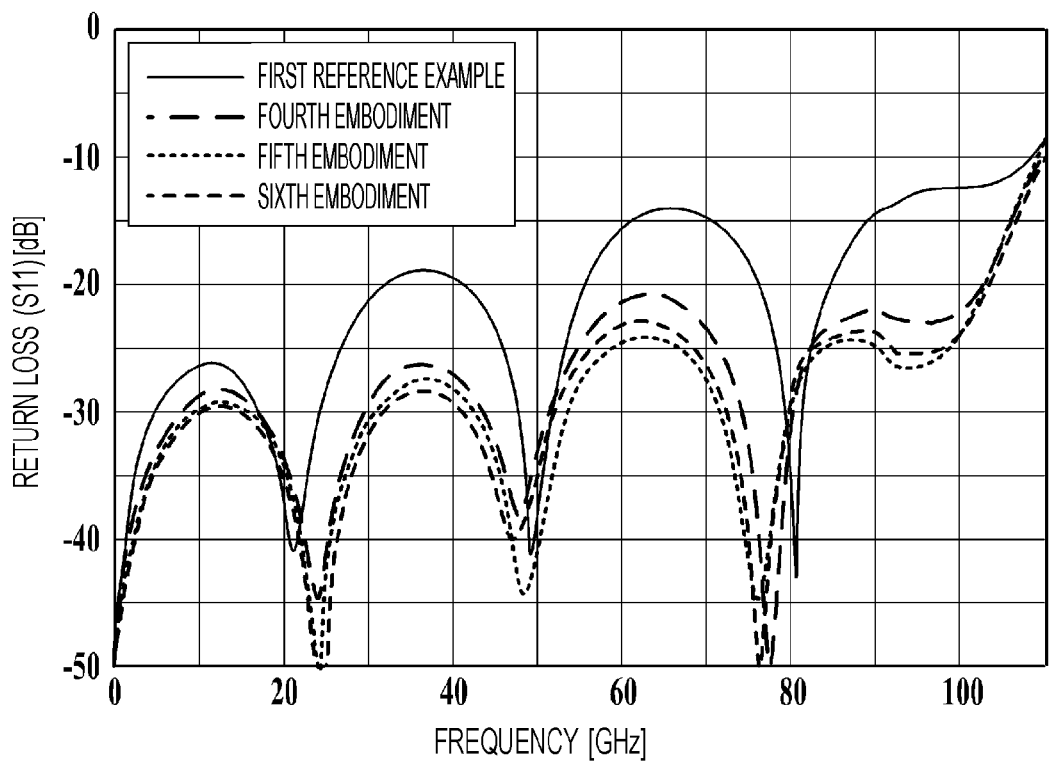
FIG. 7A is a graph illustrating return loss characteristics of the first reference example and the fourth to sixth embodiments.
Figure 7B:
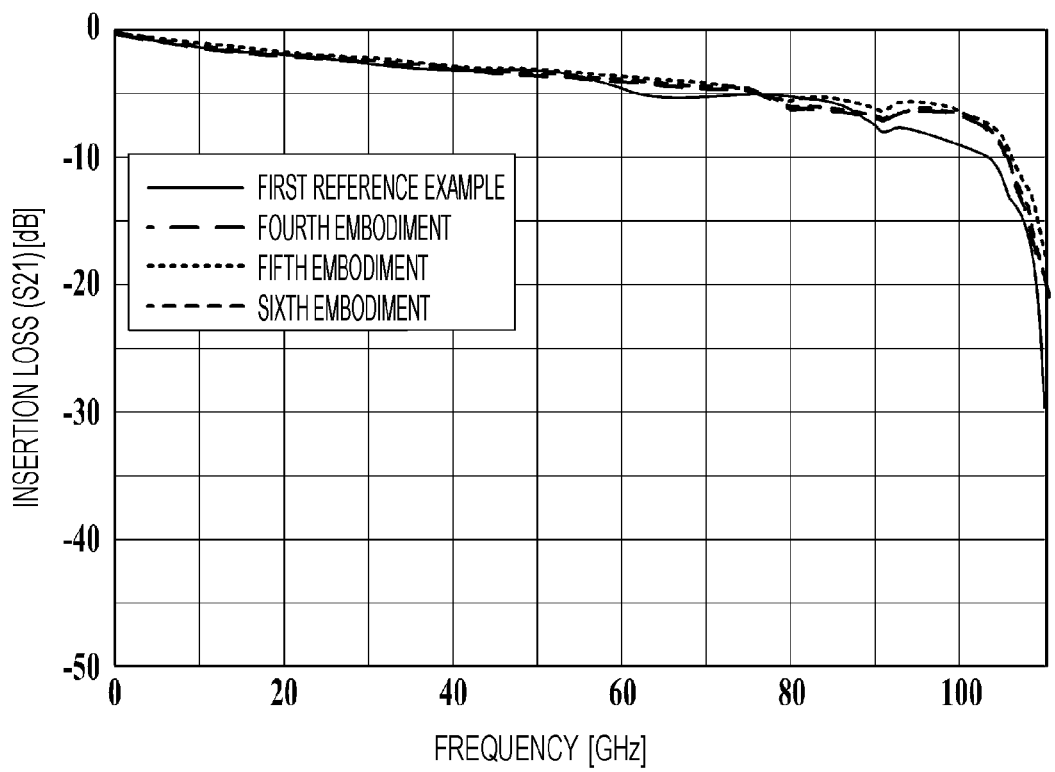
FIG. 7B is a graph illustrating insertion loss characteristics of the first reference example and the fourth to sixth embodiments.
Figure 8A:
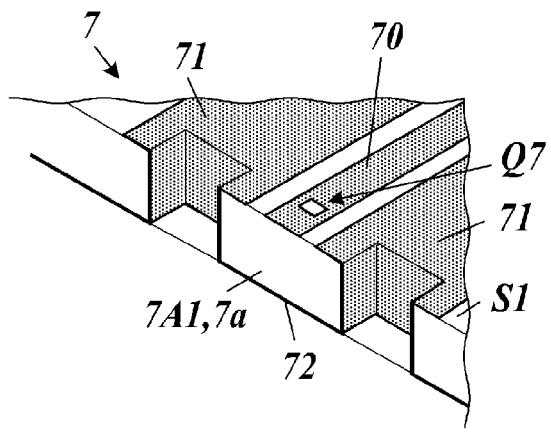
FIG. 8A is a perspective view of a pattern according to a seventh embodiment.
Figure 8B:
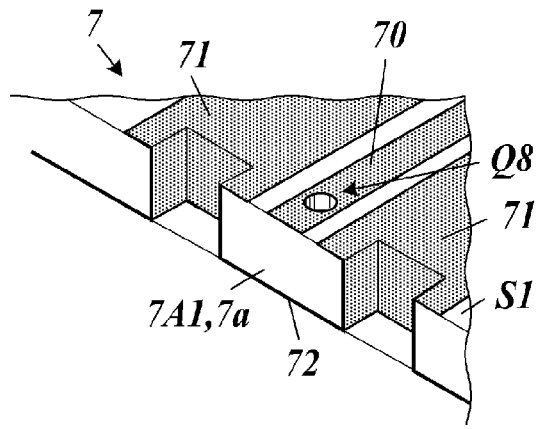
FIG. 8B is a perspective view of a pattern according to an eighth embodiment.
Figure 8C:
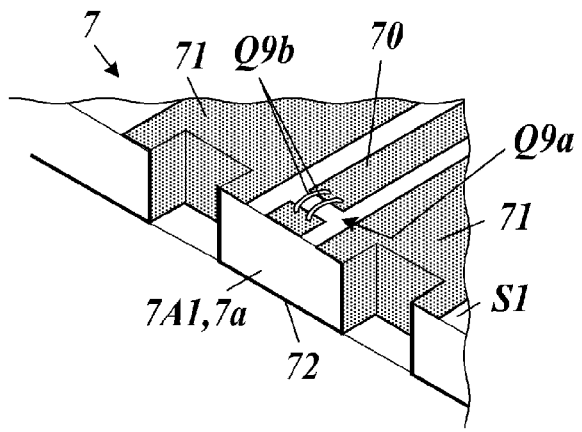
FIG. 8C is a perspective view of patterns according to a ninth embodiment.
Figure 9A:
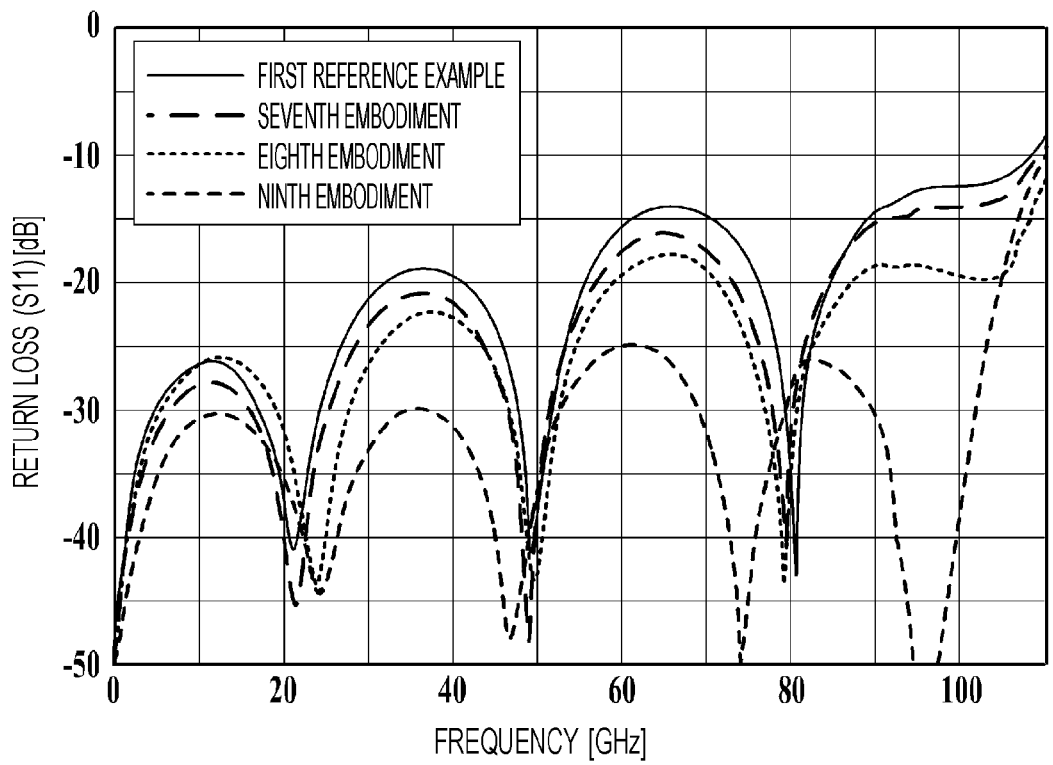
FIG. 9A is a graph illustrating return loss characteristics of the first reference example and the seventh to ninth embodiments.
Figure 9B:
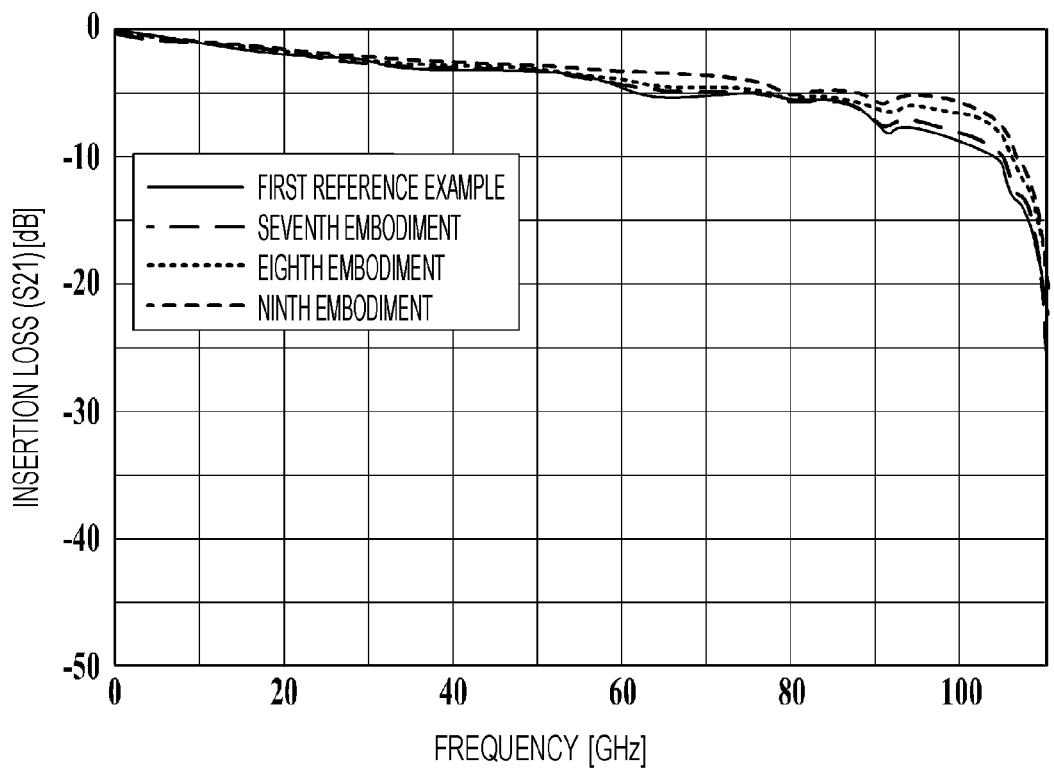
FIG. 9B is a graph illustrating insertion loss characteristics of the first reference example and the seventh to ninth embodiments.

Examples of inductive patterns will now be described. FIG. 4A is a perspective view of patterns according to the first reference example. FIGS. 4B to 4D are perspective views of patterns according to first to third embodiments. FIG. 4E is a perspective view of the patterns according to the second reference example. FIGS. 6A to 6C are perspective views of patterns according to fourth to sixth embodiments. FIGS. 8A to 8C are perspective views of patterns according to seventh to ninth embodiments. FIGS. 10A to 10D are perspective view of patterns according to tenth to thirteenth embodiments. Patterns Q1 to Q13 according to the first to thirteenth embodiments are located at a distance in the range of H/3 or more and H or less from the end of the first surface S1. In the following description, a direction that is along a film surface of the signal conductor 70 and orthogonal to the longitudinal direction of the signal conductor is referred to as a transverse direction of the signal conductor 70.

The patterns Q1 of the first embodiment illustrated in FIG. 4B are cutouts, and are provided on the signal conductor 70. The patterns Q1 are cutouts having the shape of a recess (which may be an angular or rounded recess). Each cutout may have a constant width from a front end to a rear end in a depth direction of the cutout (transverse direction of the signal conductor 70). The front end of each cutout means the open side of the cutout that is partially open. The rear end of each cutout means the side opposite to the open side of the cutout that is partially open. The signal conductor 70 includes the patterns Q1 on one and the other sides of the signal conductor 70 in the transverse direction, but may include only the pattern Q1 on one side of the signal conductor 70. The patterns Q1 provide an effect of thinning the signal conductor 70 (reducing the cross-sectional area of the current path). When the signal conductor 70 includes a thin portion, the current density increases in the thin portion, and the magnetic flux density increases in a region around the thin portion. Therefore, the inductance component increases. According to the patterns Q1, the distances between the signal conductor 70 and the first ground conductors 71 increase, so that the capacitance component decreases in this region. Thus, the patterns Q1 effectively generate an inductance component in the signal conductor 70.

The patterns Q2 of the second embodiment illustrated in FIG. 4C are cutouts, and are provided on the first ground conductors 71 at the sides adjacent to the signal conductor 70. The patterns Q2 are cutouts having the shape of a recess (which may be an angular or rounded recess). Each cutout may have a constant width from the front end to the rear end in the depth direction of the cutout (transverse direction of the signal conductor 70). The first ground conductors 71 include the patterns Q2 on one and the other sides of the signal conductor 70, but may include only the pattern Q2 on one side of the signal conductor 70. According to the patterns Q2, the distances between the signal conductor 70 and the first ground conductors 71 increase, so that the capacitance component decreases in this region. Thus, an inductance component can be generated in the signal conductor 70.

The patterns Q3 of the third embodiment illustrated in FIG. 4D are combinations of the patterns Q1 of the first embodiment and the patterns Q2 of the second embodiment. This structure also provides an effect the same as and/or similar to those of the first and second embodiments, so that an inductance component can be generated in the signal conductor 70 in a region including the patterns Q3.

The pattern Q4 of the fourth embodiment illustrated in FIG. 6A is a cutout, and is provided only on one side of the signal conductor 70 in the transverse direction. The cutout is shaped as in the first embodiment. Since the cutout is provided only on one side, the cutout may have a depth equal to or greater than half the width of the signal conductor 70. The pattern Q4 provides an effect the same as and/or similar to that of the first embodiment, so that an inductance component can be generated in the signal conductor 70.

The patterns Q5a and Q5b of the fifth embodiment illustrated in FIG. 6B are two cutouts, one being provided on the signal conductor 70 at one side in the transverse direction and the other being provided on the first ground conductor 71 at the other side in the transverse direction. The cutouts (Q5a and Q5b) have a shape the same as and/or similar to that of the patterns Q1 of the first embodiment, but may have a shape the same as and/or similar to that of any of the patterns Q10 to Q13 of the tenth to thirteenth embodiments described below.

The patterns Q5a and Q5b of the fifth embodiment also provide an effect the same as and/or similar to those of the first and second embodiments, so that an inductance component can be generated in the signal conductor 70. The results of simulations imply that when the signal conductor 70 and one of the first ground conductors 71 include respective ones of cutouts (Q5a and Q5b), high-frequency characteristics of signal transmission can be improved by disposing the cutouts (Q5a and Q5b) at opposite sides of the signal conductor 70 in the transverse direction.

The patterns Q6a and Q6b of the sixth embodiment illustrated in FIG. 6C are two cutouts, one being provided on the signal conductor 70 at one side in the transverse direction and the other being provided on the first ground conductor 71 at the same side in the transverse direction. Therefore, the patterns Q6a and Q6b face each other with a gap therebetween. The cutouts (Q6a and Q6b) have a shape the same as and/or similar to that of the patterns Q1 of the first embodiment, but may have a shape the same as and/or similar to that of any of the patterns Q10 to Q13 of the tenth to thirteenth embodiments described below. The patterns Q6a and Q6b of the sixth embodiment also provide an effect the same as and/or similar to those of the first and second embodiments, so that an inductance component can be generated in the signal conductor 70.

The pattern Q7 of the seventh embodiment illustrated in FIG. 8A is a through hole positioned in a central region of the signal conductor 70 in the transverse direction. The through hole of the pattern Q7 may have a rectangular shape, a rounded shape, or any other shape. The pattern Q7 provides an effect of thinning the signal conductor 70, and an inductance component can be generated in this region.

The pattern Q8 according to the eighth embodiment illustrated in FIG. 8B is a hole extending in the signal conductor 70 and the base 7A (plate-shaped portion 7A1). The hole may be disposed in a central region of the signal conductor 70 in the transverse direction and have a depth of about half the distance to the second ground conductor 72 (H/2). The pattern Q8 provides an effect of thinning the current path of the signal conductor 70 and an effect of reducing the capacitance component in a region including the pattern Q8. Thus, an inductance component can be generated in this region.

The patterns Q9a and Q9b of the ninth embodiment illustrated in FIG. 8C include a dividing portion (Q9a) and connection members (Q9b). The dividing portion (Q9a)

divides the signal conductor 70 into two sections in the longitudinal direction. The connection members Q9b are, for example, bonding wires, and provide electrical connection between the two sections into which the signal conductor 70 is divided. The patterns Q9a and Q9b provide an effect of thinning the current path in this region, and the capacitance component decreases because the patterns Q9b (connection members) are separated from the base 7A (plate-shaped portion 7A1) that is a dielectric. Therefore, an inductance component can be generated in this region of the signal conductor 70.

Figure 10A:
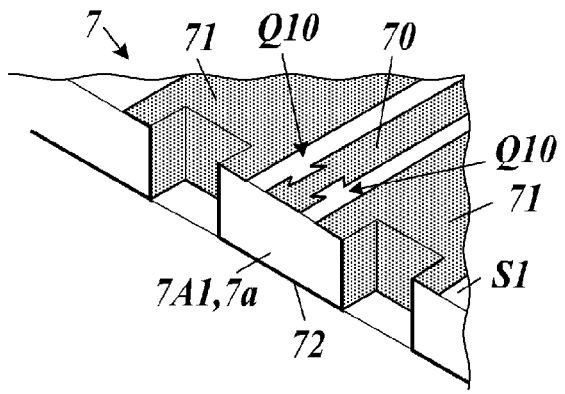
FIG. 10A is a perspective view of patterns according to a tenth embodiment.

The patterns Q10 of the tenth embodiment illustrated in FIG. 10A are cutouts having the shape of a recess. Each cutout has a width that is greater at the rear end than at the front end. In each pattern Q10, the cutout has a width that gradually increases over the entire region of the cutout in the depth direction, but may include a portion wider at the rear end than at the front end. The signal conductor 70 includes the patterns Q10 on both sides thereof in the transverse direction, but may include only the pattern Q10 on one side thereof.

The patterns Q10 provide an effect of thinning the signal conductor 70, and the distances between the signal conductor 70 and the first ground conductors 71 increase, so that the capacitance component decreases. Therefore, an inductance component can be effectively generated. Since the cutout of each pattern Q10 is narrow at the front end, influence on coupling between the signal conductor 70 and the first ground conductors 71 in high-frequency transmission can be reduced. Since the cutout of each pattern Q10 is wide at the rear and, the length of the thin portion of the signal conductor 70 can be increased. Therefore, variations in characteristics due to impedance mismatching in a frequency band for signal transmission can be reduced, and transmission characteristics can be improved.

Figure 10B:
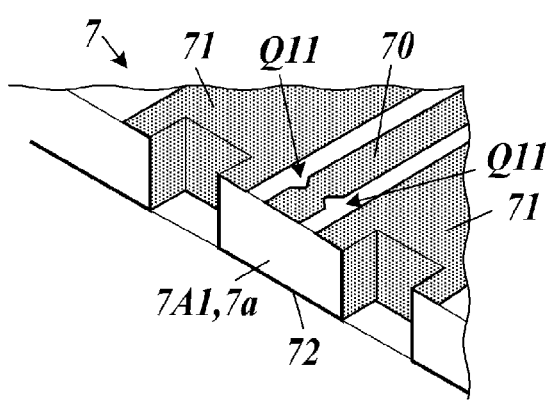
FIG. 10B is a perspective view of patterns according to an eleventh embodiment.

The patterns Q11 of the eleventh embodiment illustrated in FIG. 10B are cutouts having the shape of a recess. Each cutout has a width that is smaller at the rear end than at the front end. In each pattern Q11, the cutout has a width that gradually decreases over the entire region of the cutout in the depth direction, but may include a portion narrower at the rear end than at the front end. The signal conductor 70 includes the patterns Q11 on both sides thereof in the transverse direction, but may include only the pattern Q11 on one side thereof. The patterns Q11 also provide an effect of thinning the signal conductor 70 and an effect of reducing the capacitance component of the signal conductor 70. Therefore, an inductance component can be generated in this region.

Figure 10C:
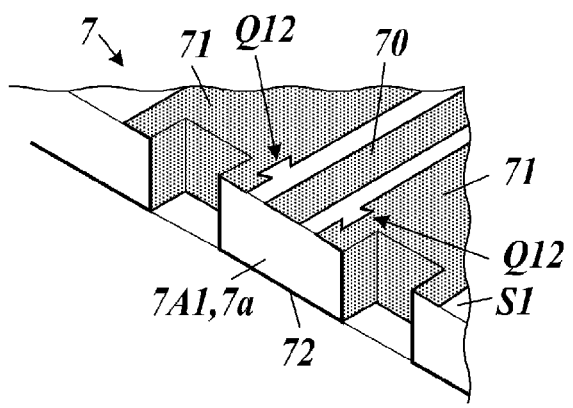
FIG. 10C is a perspective view of patterns according to a twelfth embodiment.

The patterns Q12 of the twelfth embodiment illustrated in FIG. 10C are cutouts having the shape of a recess, and are provided on the first ground conductors 71 at the sides adjacent to the signal conductor 70. Each cutout has a width that is greater at the rear end than at the front end. In each pattern Q12, the cutout has a width that gradually increases over the entire region of the cutout in the depth direction, but may include a portion that is wider at the rear end than at the front end. The first ground conductors 71 include the patterns Q12 on one and the other sides of the signal conductor 70, but may include only the pattern Q12 on one side of the signal conductor 70. The patterns Q12 also provide an effect the same as and/or similar to that of the patterns Q2 according to the second embodiment, so that an inductance component can be generated in the signal conductor 70 at a location near the patterns Q12.

Figure 10D:
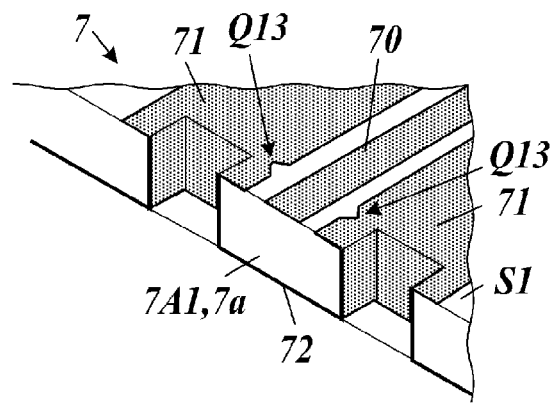
FIG. 10D is a perspective view of patterns according to a thirteenth embodiment.
Figure 11A:
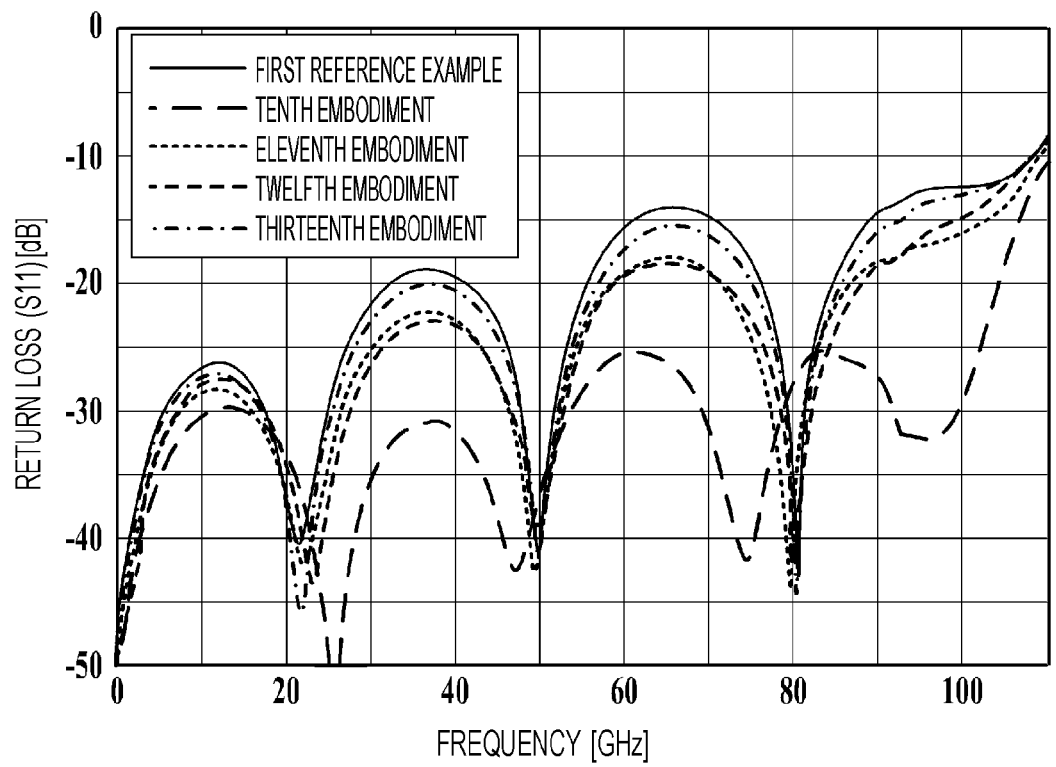
FIG. 11A is a graph illustrating return loss characteristics of the first reference example and the tenth to thirteenth embodiments.
Figure 11B:
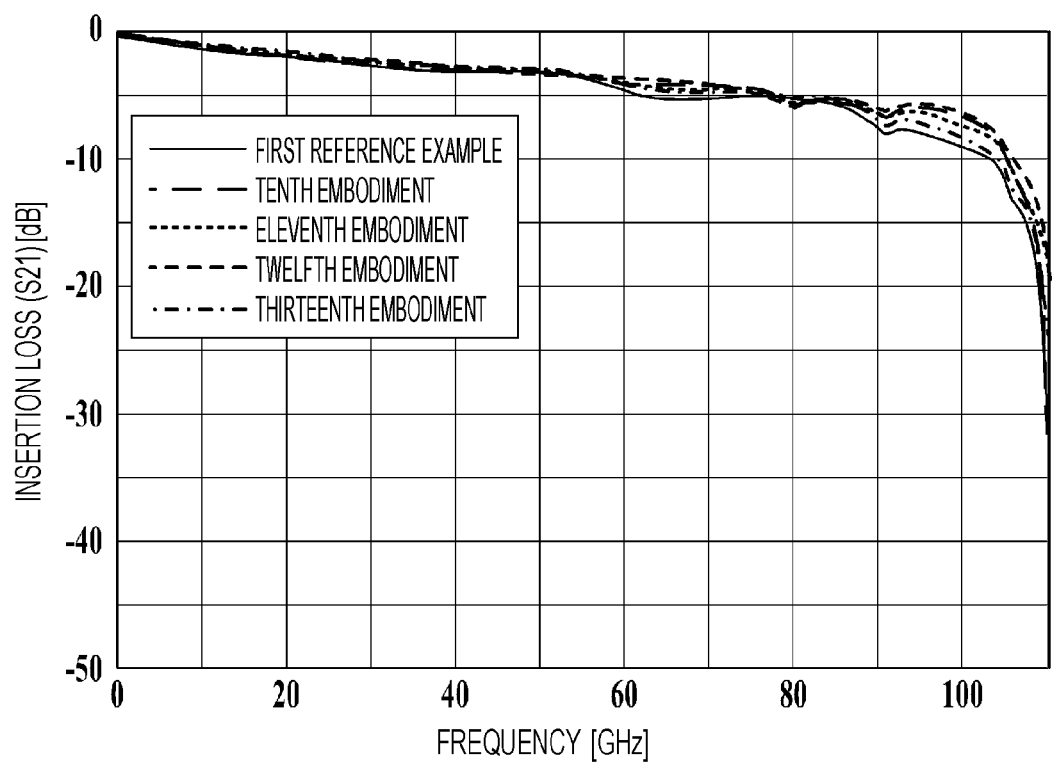
FIG. 11B is a graph illustrating insertion loss characteristics of the first reference example and the tenth to thirteenth embodiments.

The patterns Q13 of the thirteenth embodiment illustrated in FIG. 10D are cutouts having the shape of a recess, and are provided on the first ground conductors 71 at the sides adjacent to the signal conductor 70. Each cutout has a width that is smaller at the rear end than at the front end. In each pattern Q13, the cutout has a width that gradually decreases over the entire region of the cutout in the depth direction, but may include a portion that is narrower at the rear end than at the front end. The first ground conductors 71 include the patterns Q13 on one and the other sides of the signal conductor 70, but may include only the pattern Q13 on one side of the signal conductor 70. The patterns Q13 also provide an effect the same as and/or similar to that of the patterns Q2 according to the second embodiment, so that an inductance component can be generated in the signal conductor 70 at a location near the patterns Q13.

FIGS. 5A and 5B are graphs illustrating return loss characteristics and insertion loss characteristics of the first and second reference examples and the first to third embodiments. FIGS. 7A, 9A, and 11A and FIGS. 7B, 9B, and 11B are graphs illustrating return loss characteristics and insertion loss characteristics of the first reference example and the fourth to thirteenth embodiments. As is clear from the graphs, according to the wiring boards 7 of the first to thirteenth embodiments including the patterns Q1 to Q13, the return loss and the attenuation of an insertion signal in a high frequency region are less than those in the first reference example including no patterns (FIG. 4A).

As described above, according to the wiring boards 7 of the first to thirteenth embodiments, the patterns Q1 to Q13 enable an improvement of the high-frequency characteristics of signal transmission. According to the package 1 for containing an electronic component including the wiring boards 7, the wiring boards 7 allow transmission of a high-frequency signal inside and outside the recess U1, and the patterns Q1 to Q13 enable an improvement of the high-frequency characteristics of signal transmission.

(Electronic Device and Electronic Module)

Figure 12:
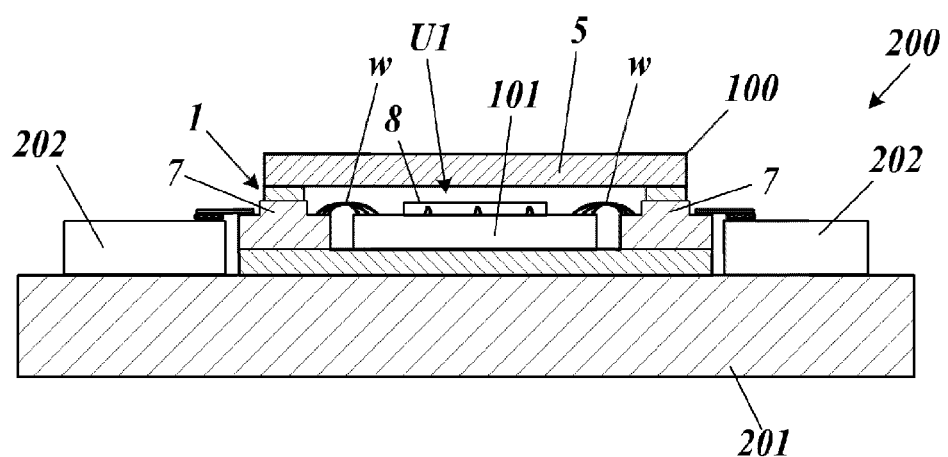
FIG. 12 illustrates an electronic device and an electronic module according to an embodiment of the present disclosure.

FIG. 12 illustrates an electronic device and an electronic module according to an embodiment of the present disclosure. As illustrated in FIGS. 1 and 12, an electronic device 100 according to the present embodiment includes the package 1 for containing an electronic component, the electronic component 101, and the lid 5. The electronic component 101 is mounted in the recess U1. The lid 5 covers the opening of the recess U1. The electronic component 101 inputs and outputs a high-frequency signal. The electronic component 101 may be, for example, a semiconductor device or an optical communication device, and the type thereof is not particularly limited. The electronic component 101 includes signal electrodes and ground electrodes at a height that is the same as and/or similar to the height of the first surface S1 (FIG. 2A) of the base 7A. The connection members w, such as bonding wires, electrically connect the signal electrodes to respective ones of the signal conductors 70 of the wiring boards 7, and the ground electrodes to respective ones of the first ground conductors 71 disposed on one and the other sides of each signal conductor 70. The electronic component 101 also includes power supply electrodes. The connection members w, such as bonding wires, also electrically connect the power supply electrodes to respective ones of the wiring conductors 8B of the non-high-frequency wiring boards 8.

Each wiring board 7 may include a conductor film on an upper surface or a lower surface of the wiring board 7, the conductor film being electrically connected to the first ground conductors 71, the second ground conductor 72, and the third ground conductor 73. The conductor film may be electrically connected to the metal case 4. In such a case, the connection between the electronic component 101 and the first ground conductors 71 by the corresponding connection members w may be omitted.

Figure 13:
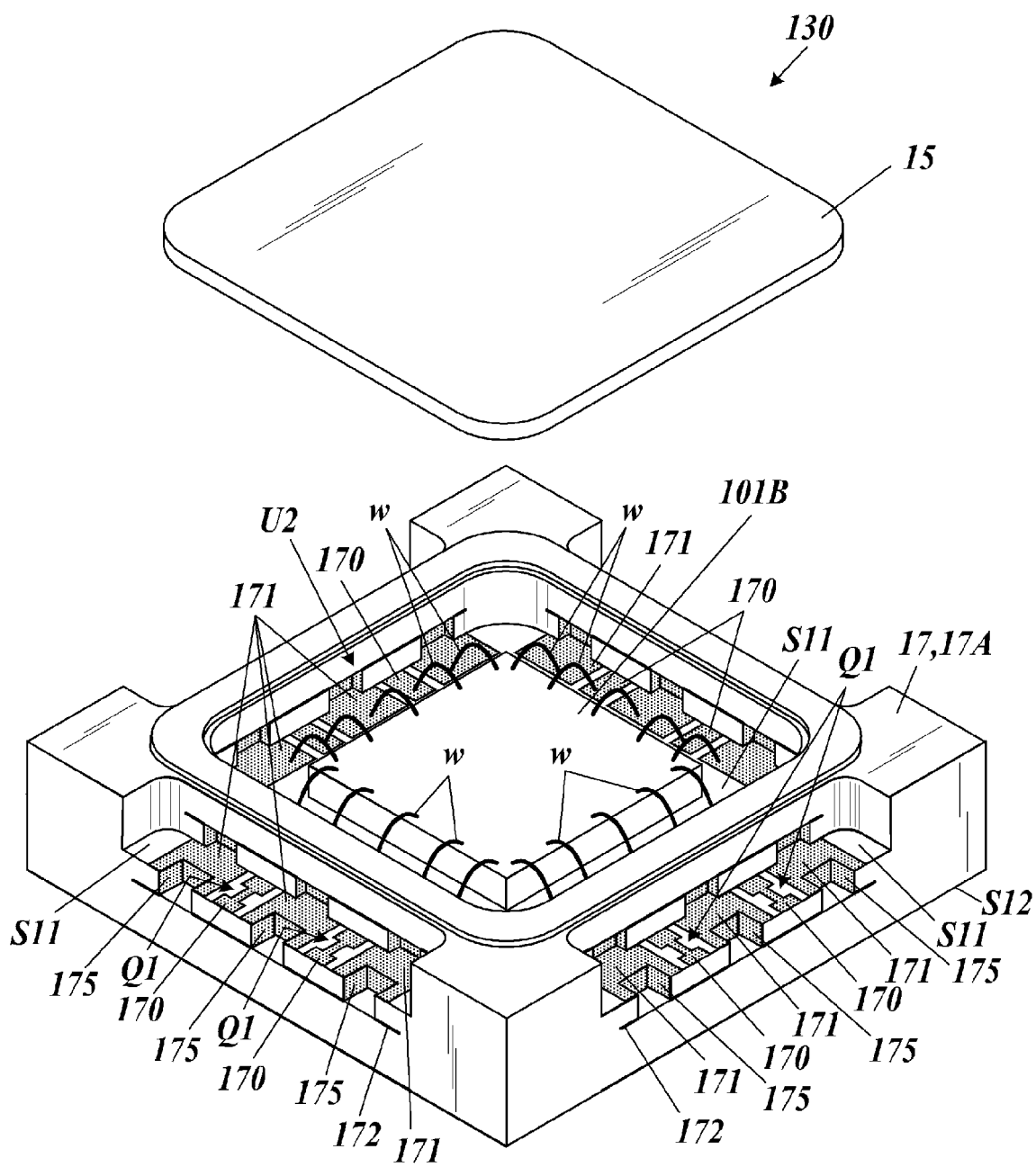
FIG. 13 is an exploded perspective view of an electronic device according to another embodiment of the present disclosure.

FIG. 13 illustrates an electronic device according to another embodiment of the present disclosure. An electronic device 130 according to the present embodiment includes a wiring board 17 and an electronic component 101B mounted on the wiring board 17. The wiring board 17 includes a base 17A, signal conductors 170, first ground conductors 171, a second ground conductor 172, and connection conductors 175. The base 17A includes a first surface S11 and a second surface S12 opposite to the first surface S11. The signal conductors 170 are disposed on the first surface S11 and extend to outer end portions. The first ground conductors 171 are disposed on the first surface S11 and extend to the outer end portions. The second ground conductor 172 extends to the outer end portions of the base 17A in the base 17A. The connection conductors 175 electrically connect the first ground conductors 171 to the second ground conductor 172. Each signal conductor 170 is disposed between and spaced from two first ground conductors 171 in the transverse direction of the signal conductor 170. The second ground conductor 172 may be disposed on the second surface S12. The base 17A is composed of a dielectric, and may include a multilayer structure including a plurality of dielectric layers.

The structures of the signal conductors 170, the first ground conductors 171, the second ground conductor 172, and the connection conductors 175 are the same as and/or similar to those of the signal conductor 70, the first ground conductors 71, the second ground conductor 72, and the connection conductors 75 in the above-described embodiment. However, although the signal conductor 70 and the first ground conductors 71 described above extend from one end portion to the other end portion of the base 7A, each of the signal conductors 170 and the first ground conductors 171 extends to one end portion (outer end portion) of the base 17A while the other end (inner end portion) thereof terminates on the first surface S11. Each pattern Q1 is disposed near one end portion of the base 17A. In FIG. 13, the patterns Q1 are simplified, and the positions and sizes thereof differ from the actual positions and sizes.

The signal conductors 170 and the first ground conductors 171 terminate at locations near the region in which the electronic component 101B is mounted, and are electrically connected to respective electrodes of the electronic component 101B by connection members w, such as bonding wires.

The wiring board 17 may include structures that are the same as and/or similar to the third ground conductor 73 and the connection conductors 76 of the above-described embodiment.

The wiring board 17 and the base 17A may include a recess U2 that accommodates the electronic component 101B. A lid 15 may cover an opening of the recess U2. Alternatively, the wiring board 17 may include no recess U2 and include a plate-shaped structure with the first surface S11 serving as a plate surface.

Figure 14A:
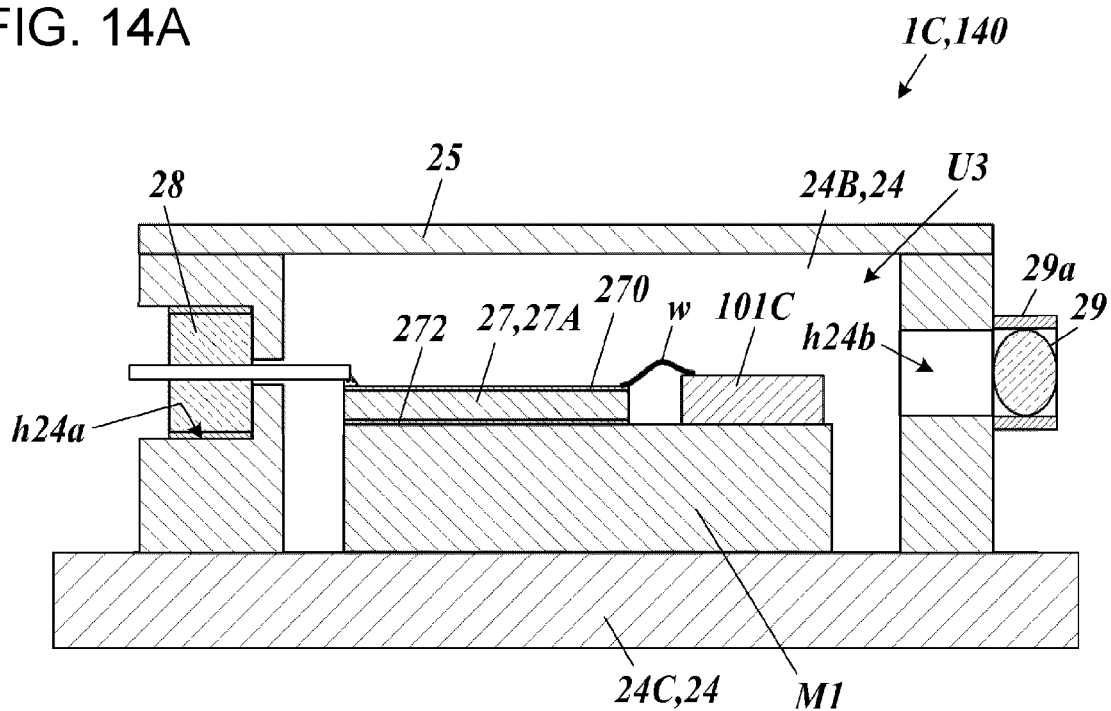
FIG. 14A is a sectional view of an electronic device according to another embodiment of the present disclosure.
Figure 14B:
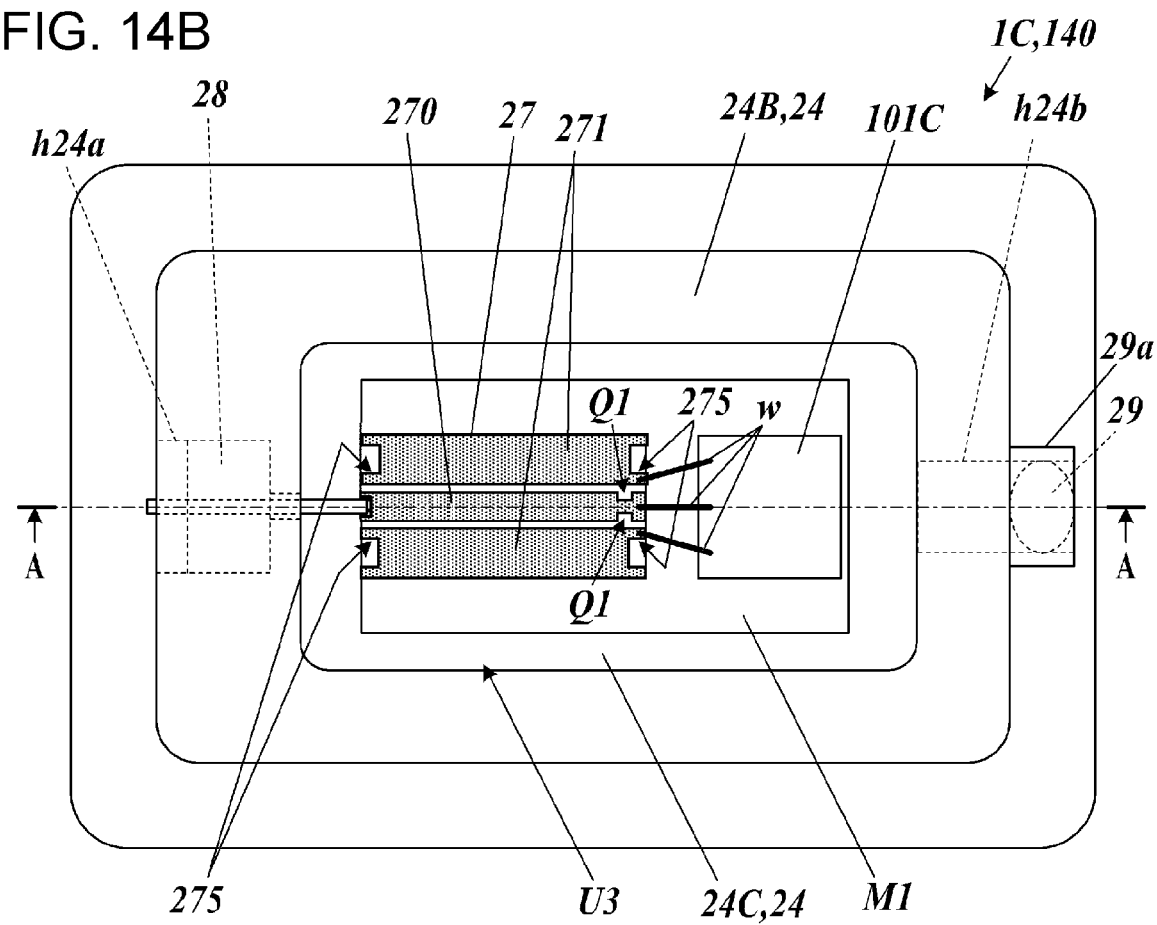
FIG. 14B is a plan view of an electronic device according to another embodiment of the present disclosure.

FIG. 14A is a sectional view of an electronic device according to another embodiment of the present disclosure. FIG. 14B is a plan view of the electronic device. The sectional view of FIG. 14A is taken along line A-A in FIG. 14B. In FIG. 14B, a lid 25 is omitted.

An electronic device 140 according to the embodiment illustrated in FIGS. 14A and 14B includes a metal case 24, a wiring board 27, an electronic component 101C, a lid 25, a coaxial component 28, and a window member 29. The wiring board 27 serves as a relay substrate. The coaxial component 28 includes a central conductor and an outer peripheral conductor, and transmits a high-frequency signal. The window member 29 transmits an optical signal. The metal case 24 includes a wall 24B, a bottom 24C, and a recess U3 surrounded by the wall 24B and the bottom 24C. A block M1 is disposed in the recess U3. The block M1 matches the heights of the wiring board 27 and the electronic component 101C with the heights of signal paths. The wiring board 27 and the electronic component 101C are mounted on the block M1. The block M1 may be integrated with the metal case 24. Alternatively, depending on the height of the wiring board 27 and the height of the electronic component 101C, the block M1 may be omitted. The lid 25 is joined to the top surface of the wall 24B and seals the recess U3. The wall 24B includes a through hole h24a and a through hole h24b. The through hole h24a accommodates the coaxial component 28. The through hole h24b transmits the optical signal. The coaxial component 28 is accommodated in the through hole h24a, and the outer peripheral conductor of the coaxial component 28 is joined to the wall 24B with a conductive joining material. The window member 29 is light transmissive, and is fixed with a fixation member 29a to block the through hole h24b. The electronic component 101C is an optical semiconductor device that receives a high frequency electric signal and outputs an optical signal.

The wiring board 27 corresponds to an embodiment of a wiring board according to the present disclosure. The overall structure of the wiring board 27 may be the structure illustrated in FIG. 3 (relevant part of the wiring board 7 according to the first embodiment). The wiring board 27 includes a base 27A that is a dielectric, a signal conductor 270, first ground conductors 271, a second ground conductor 272, and connection conductors 275. The base 27A is plate-shaped. The structures of the signal conductor 270, the first ground conductors 271, the second ground conductor 272, and the connection conductors 275 are the same as and/or similar to those of the signal conductor 70, the first ground conductors 71, the second ground conductor 72, and the connection conductors 75 according to the first embodiment. The signal conductor 270 may include the patterns Q1 according to the first embodiment. Any of the above-described patterns of various examples may be provided. The pattern or patterns may be provided on at least one selected from the group consisting of the signal conductor 270 and the first ground conductors 271. The base 27A may include a dielectric layer disposed below the second ground conductor 272 (at a side opposite to the side provided with the signal conductor 270).

One end portion of the signal conductor 270 is electrically connected to the central conductor of the coaxial component 28 with a conductive joining material or the like. The other end portion of the signal conductor 270 is connected to a signal terminal of the electronic component 101C by a corresponding connection member w, such as a bonding wire. The signal conductor 270 includes patterns Q1 at a location near the other end portion, and includes no patterns Q1 at a location near the one end portion. The first ground conductors 271, the second ground conductor 272, and the connection conductors 275 are electrically connected to the outer peripheral conductor of the coaxial component 28 through the metal case 24 and the block M1. An other end portion of each first ground conductor 271 is connected to a ground terminal of the electronic component 101C by a corresponding connection member w, such as a bonding wire. One end portion of each first ground conductor 271 may be connected to a portion of the wall 24B close to the coaxial component 28 by a conductive connection member. In such a case, the signal conductor 270 may additionally include the patterns Q1 at a location near the one end portion.

The structure of the electronic device 140 excluding the electronic component 101C corresponds to an example of a package 1C for containing an electronic component according to an embodiment of the present disclosure.

In the example illustrated in FIGS. 14A and 14B, the package 1C for containing an electronic component and the electronic device 140 output an optical signal. However, the package for containing an electronic component and the electronic device may include no structure for receiving and outputting an optical signal, and may receive and output an electric signal or a radio signal. In such a case, the wiring board 27 according to the embodiment may be used as a relay substrate.

As illustrated in FIG. 12, in the present embodiment, an electronic module 200 includes a module substrate 201 and the electronic device 100 mounted on the module substrate 201. In addition to the electronic device 100, an electric device, an electronic element, an electric element, an optical device, and the like may also be mounted on the module substrate 201. The electronic device 100 may be electrically connected to a signal line or a ground conductor on the module substrate 201 through a relay substrate 202. Instead of the electronic device 100 illustrated in FIG. 12, the electronic device 130 illustrated in FIG. 13 or the electronic device 140 illustrated in FIG. 14 may be mounted on the module substrate 201 in the same and/or similar manner.

According to the electronic devices 100, 130, and 140 and the electronic module 200 of the present embodiment, since the wiring boards 7 and 17 having good high-frequency characteristics are provided, the electronic devices 100, 130, and 140 and the electronic module 200 can have improved high-frequency characteristics.

Embodiments of the present disclosure have been described. However, the wiring board, the package for containing an electronic component, the electronic device, and the electronic module according to the present disclosure are not limited to the above-described embodiments. For example, when the patterns are provided on the signal conductors 70, 170, and 270 at both sides in the transverse direction, the patterns at one and the other sides may be patterns of different structures (for example, patterns Q1, Q10, and Q11). When the patterns are provided on the ground conductors 71, 171, and 271 disposed on one and the other sides of the signal conductors 70, 170, and 270, the patterns at one and the other sides may be patterns of different structures (for example, patterns Q2, Q12, and Q13). Also when the patterns are provided on both the signal conductors 70, 170, and 270 and the first ground conductors 71, 171, and 271, the patterns of different structures may be applied.

In the above-described embodiment, each wiring board 7 includes any of the patterns Q1 to Q13 at both a location near the inner end portion and a location near the outer end portion. However, any of the patterns Q1 to Q13 may be provided at only one of a location near the outer end portion and a location near the inner end portion. The signal conductor 270 of the wiring board 27 may also include the patterns at both a location near one end portion and a location near the other end portion. The number of wiring boards 7 included in one package for containing an electronic component may be one, or three or more. Although examples of inductive patterns are described in the above-described embodiment, the patterns may include any structure as long as inductance can be applied. In the above-described embodiment, portions of each signal conductor that are closer to and farther from the end than the patterns Q1 to Q13 have the same width. However, the portion closer to the end may have a greater width to make an adjustment for an inductance of the connection member (bonding wire) w. Other details described in the embodiments may be changed as appropriate.

INDUSTRIAL APPLICABILITY

The present disclosure is applicable to a wiring board, a package for containing an electronic component, an electronic device, and an electronic module.

REFERENCE SIGNS 1 package for containing an electronic component
4, 24 metal case
4B, 24B wall
4C, 24C bottom
4D mount base
5, 15, 25 lid
7, 17, 27 wiring board
7A, 17A, 27A base
7A1 plate-shaped portion
7A2 step portion
7a dielectric layer
70, 170, 270 signal conductor
71, 171, 271 first ground conductor
72, 172, 272 second ground conductor
75, 175, 275 connection conductor
75c castellation conductor
75v via conductor
S1, S11 first surface
S2, S12 second surface
U1, U2, U3 recess
Q1 to Q13 pattern
H distance
100, 130, 140 electronic device
101, 101B, 101C electronic component
200 electronic module
201 module substrate

The invention claimed is:

1. A wiring board comprising: a base composed of a dielectric and comprising a first surface and a second surface opposite to the first surface; a signal conductor disposed on the first surface and extending to an end portion of the base; two first ground conductors disposed on the first surface and extending to the end portion with the signal conductor disposed between the first ground conductors; a second ground conductor disposed in the base or on the second surface, the second ground conductor facing the signal conductor and extending to the end portion; and connection conductors electrically connecting respective ones of the first ground conductors to the second ground conductor, wherein the signal conductor and the second ground conductor are separated from each other by a distance H, and wherein the signal conductor and the first ground conductors each comprise a cutout pattern disposed at a distance of equal to or greater than $\frac{1}{3}$ of the distance H and equal to or less than the distance H from the end portion, the pattern being inductive.

2. The wiring board according to claim 1, wherein the signal conductor comprises the pattern.

3. The wiring board according to claim 1, wherein the first ground conductors comprise the pattern at a side adjacent to the signal conductor.

4. The wiring board according to claim 1, wherein the cutout comprises a portion wider at a rear end than at a front end.

5. A package for containing an electronic component, the package comprising:
 the wiring board according to claim 1; and a metal case configured to contain an electronic component.

6. An electronic device comprising: the wiring board according to claim 1 and an electronic component mounted on the wiring board.

7. An electronic module comprising: the electronic device according to claim 6; and a module substrate, the electronic device being mounted on the module substrate.

8. An electronic device comprising: the package for containing an electronic component according to claim 5; and an electronic component mounted in the package for containing an electronic component.

* * * * *